United States Patent
Hasegawa

(10) Patent No.: US 8,513,538 B2
(45) Date of Patent: Aug. 20, 2013

(54) TELEVISION APPARATUS, ELECTRONIC DEVICE, AND CIRCUIT BOARD STRUCTURE

(75) Inventor: Kenji Hasegawa, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 45 days.

(21) Appl. No.: 12/957,926

(22) Filed: Dec. 1, 2010

(65) Prior Publication Data

US 2011/0292296 A1   Dec. 1, 2011

(30) Foreign Application Priority Data

May 31, 2010   (JP) .................................. 2010-124935

(51) Int. Cl.
*H05K 1/11*   (2006.01)
(52) U.S. Cl.
USPC ............ 174/265; 361/704; 361/760; 361/764
(58) Field of Classification Search
USPC ......... 361/704, 719, 764, 760, 762; 174/250, 174/252, 260–262, 264–266; 29/825, 829, 29/831, 840, 842–843, 846, 854
See application file for complete search history.

(56) References Cited

U.S. PATENT DOCUMENTS

| | | | | |
|---|---|---|---|---|
| 4,396,936 A * | 8/1983 | McIver et al. | .................. | 174/252 |
| 4,791,248 A * | 12/1988 | Oldenettel | ..................... | 174/265 |
| 5,243,142 A * | 9/1993 | Ishikawa et al. | .............. | 174/262 |
| 5,319,159 A * | 6/1994 | Watanabe et al. | ............. | 174/262 |
| 6,190,941 B1 * | 2/2001 | Heinz et al. | ................... | 438/106 |
| 6,441,312 B1 * | 8/2002 | Tanimura et al. | ............. | 174/252 |
| 6,820,798 B1 * | 11/2004 | Heinz et al. | ..................... | 228/254 |
| 6,929,975 B2 * | 8/2005 | Heinz et al. | ..................... | 438/106 |
| 7,026,664 B2 * | 4/2006 | Divakar et al. | ................ | 257/107 |
| 7,518,237 B2 * | 4/2009 | Clyne et al. | ..................... | 257/724 |
| 8,166,650 B2 * | 5/2012 | Thomas | .......................... | 29/852 |
| 2002/0050380 A1 | 5/2002 | Tanimura et al. | | |
| 2007/0001297 A1 | 1/2007 | Higasa et al. | | |
| 2009/0294165 A1 * | 12/2009 | Thomas | ........................ | 174/263 |

FOREIGN PATENT DOCUMENTS

| | | |
|---|---|---|
| JP | 8-078850 | 3/1996 |
| JP | HE108-000599 | 4/1996 |
| JP | HEI08-000599 | 4/1996 |
| JP | 2001-352173 | 12/2001 |
| JP | 2002-0264468 | 1/2002 |
| JP | 2003-273479 | 9/2003 |
| JP | 2006-147723 | 6/2006 |
| JP | 2007-012850 | 1/2007 |
| JP | 2008-226983 | 9/2008 |

OTHER PUBLICATIONS

Japanese Patent Application No. 2010-124935, Notice of Rejection, mailed Feb. 1, 2011, (with English Translation).

* cited by examiner

*Primary Examiner* — Zachary M Pape
(74) *Attorney, Agent, or Firm* — Blakely, Sokoloff, Taylor & Zafman LLP

(57) ABSTRACT

According to one embodiment, a television apparatus includes a circuit board, a pad, a heat-transfer layer, and a block. The circuit board is mounted with an electronic component. The pad is provided on a surface of the circuit board. The heat-transfer layer is formed on the inner surface of a through hole in the circuit board. The through hole has an opening on the pad. The block contains a resin material and is located inside the heat-transfer layer to block the through hole.

7 Claims, 4 Drawing Sheets

TELEVISION APPARATUS, ELECTRONIC DEVICE, AND CIRCUIT BOARD STRUCTURE

CROSS-REFERENCE TO RELATED APPLICATIONS

This application is based upon and claims the benefit of priority from Japanese Patent Application No. 2010-124935, filed May 31, 2010, the entire contents of which are incorporated herein by reference.

FIELD

Embodiments described herein relate generally to a television apparatus, an electronic device, and a circuit board structure.

BACKGROUND

There have been known electronic devices in which a through hole is formed in a circuit board to have an opening on a pad. A plated layer is formed on the inner circumference surface of the through hole, and a circular resist is formed around the opening of the through hole to prevent solder from flowing into the through hole (see, for example, Patent Application Publication (KOKAI) No. 2008-226983).

This type of electronic devices are required to be capable of preventing solder from flowing into the through hole and also to have a structure such that trouble is less likely to occur.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

DETAILED DESCRIPTION

Various embodiments will be described hereinafter with reference to the accompanying drawings. In general, according to one embodiment, a television apparatus comprises a circuit board, a pad, a heat-transfer layer, and a block. The circuit board is configured to be mounted with an electronic component. The pad is provided on a surface of the circuit board. The heat-transfer layer is formed on the inner surface of a through hole in the circuit board. The through hole has an opening on the pad. The block contains a resin material and is located inside the heat-transfer layer to block the through hole.

According to another embodiment, an electronic device comprises a circuit board, a pad, a heat-transfer layer, and a block. The circuit board is configured to be mounted with an electronic component. The pad is provided on a surface of the circuit board. The heat-transfer layer is formed on the inner surface of a through hole in the circuit board. The through hole has an opening on the pad. The block contains a resin material and is located inside the heat-transfer layer to block the through hole.

According to still another embodiment, a circuit board structure comprises a circuit board, a pad, a heat-transfer layer, and a block. The circuit board is configured to be mounted with an electronic component. The pad is provided on a surface of the circuit board. The heat-transfer layer is formed on the inner surface of a through hole in the circuit board. The through hole has an opening on the pad. The block contains a resin material and is located inside toe heat-transfer layer to block the through hole.

Figure 1:
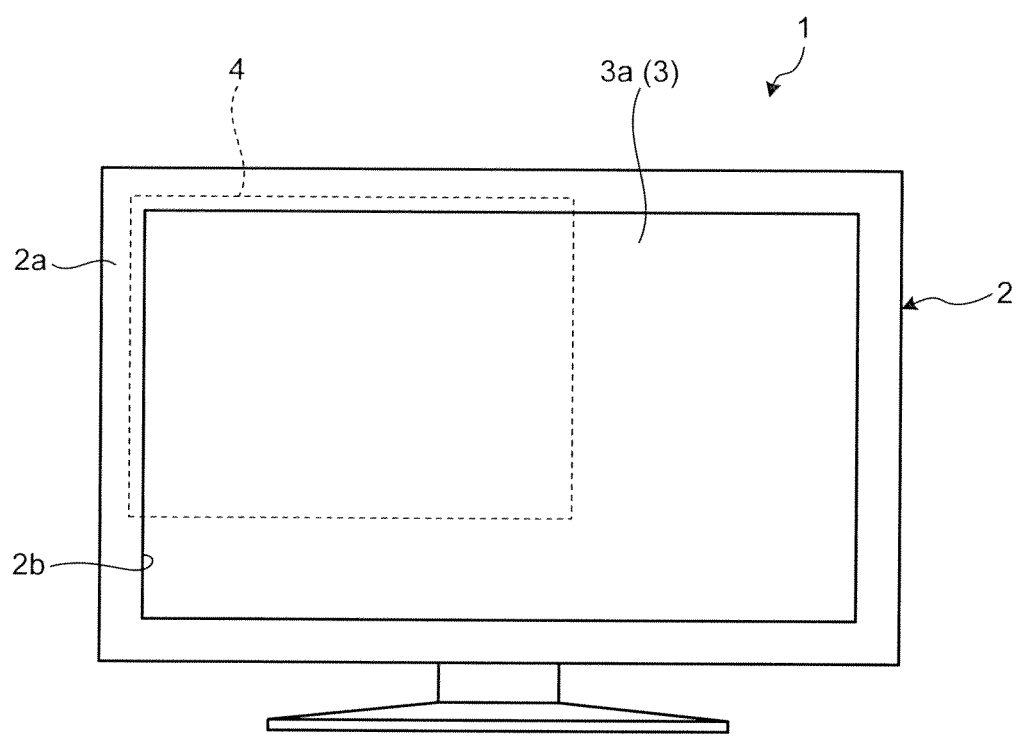
FIG. 1 is an exemplary front view of a television apparatus as an electronic device according to a first embodiment.

As illustrated in FIG. 1, a television apparatus 1 as an electronic device according to a first embodiment has rectangular appearance in a front view (a plan view of the front surface). The television apparatus 1 comprises a housing 2, a display panel 3 as a display device, and a circuit board 4 such as a printed circuit board (PCB). The display panel 3 may be, for example, a liquid crystal display (LCD) panel, and has a display screen 3a which is exposed from an opening 2b formed in a front surface 2a of the housing 2. The circuit board 4 has an electronic component (not illustrated) mounted thereon. The display panel 3 and the circuit board 4 are fixed to the housing 2 with a screw (not illustrated) or the like. In the first embodiment, the circuit board 4 having an electronic component and the like mounted thereon corresponds to a circuit board structure.

The display panel 3 is formed into a flat rectangular parallelepiped shape in the front-back direction (the direction perpendicular to the plane of FIG. 1). The display panel 3 receives a video signal from a video signal processing circuit in a control circuit comprising an electronic component or the like (all not illustrated) mounted on the circuit board 4, thereby displaying video including a still image and a moving image on the display screen 3a on the front side. The control circuit of the television apparatus 1 comprises, in addition to the video signal processing circuit, a tuner, a high-definition multimedia interface (HDMI), a signal processor, an audio/video (AV) input terminal, a remote control signal receiver, a controller, a selector, an on-screen display interface, a storage module such as a read only memory (ROM), a random access memory (RAM), and a hard disk drive (HDD), and an audio signal processing circuit (all not illustrated). The circuit board 4 is housed behind the display panel 3 in the housing 2. The television apparatus 1 further comprises a built-in amplifier, speaker, and the like (all not illustrated) for outputting audio.

Figure 2:
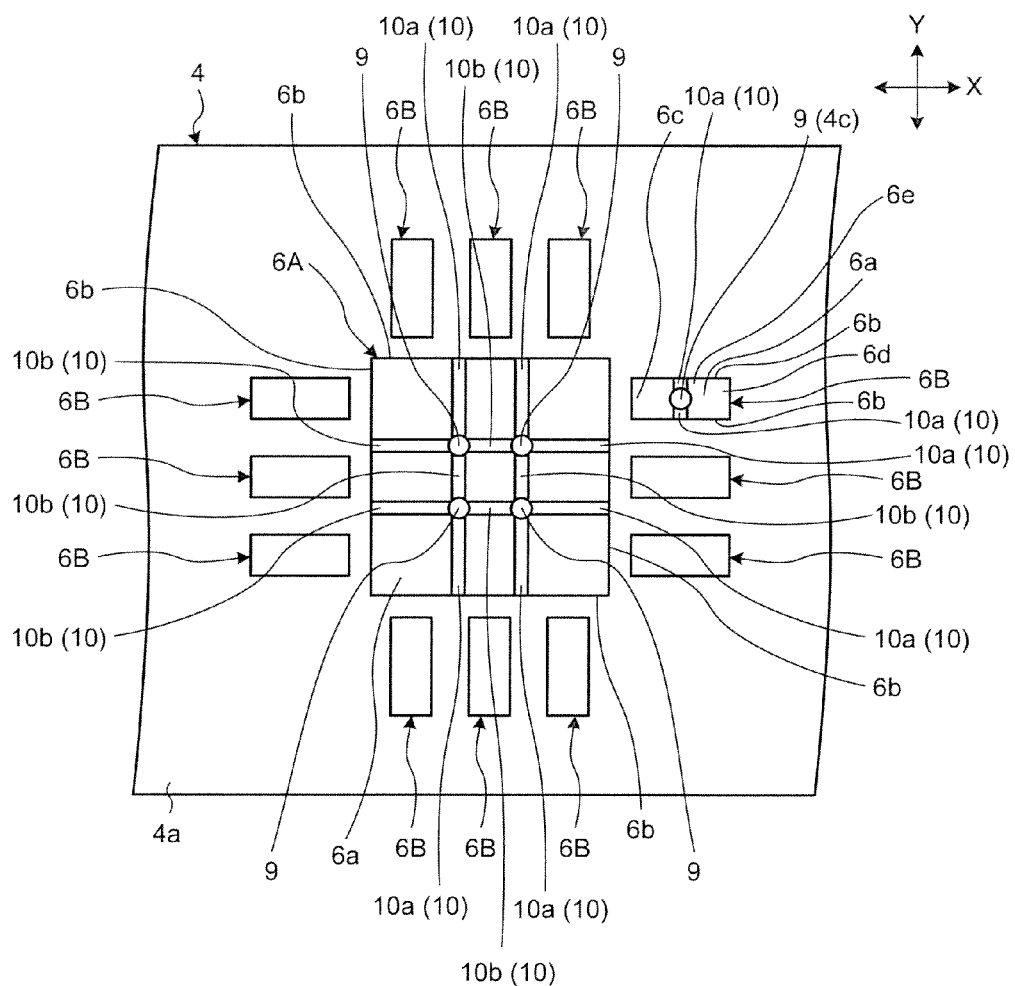
FIG. 2 is an exemplary plan view schematically illustrating the state before part of electronic components is mounted on a circuit board of the television apparatus in the first embodiment.
Figure 3:
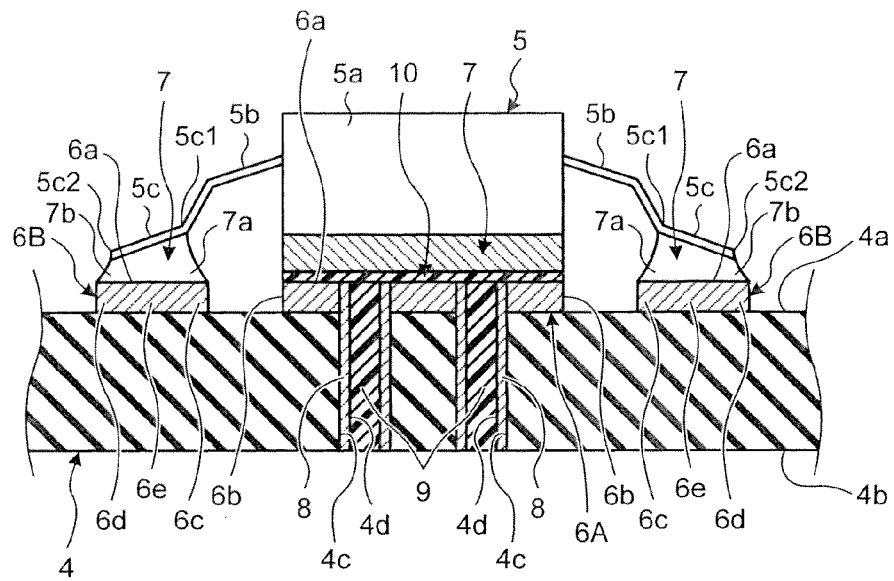
FIG. 3 is an exemplary cross-sectional view of a portion FIG. 2 schematically illustrating the state where part of electronic components is mounted on the circuit board of the television apparatus in the first embodiment.

As illustrated in FIGS. 2 and 3, pads 6A and 6B are provided on a front surface 4a of the circuit board 4 as a conductor such as copper foil. An electronic component 5 is mounted on the pads 6A and 6B through solder 7. The electronic component 5 is a surface mount device (SMD). While the electronic component 5 will be described hereinafter as being configured as a quad flat package (QFP), this is by way of example and not limitation. The electronic component 5 may be, for example, ball grid array (BGA), small outline package (SOP), or the like.

In the first embodiment, the pad 6A is formed in a square shape and, as illustrated in FIG. 3, is of substantially the same size as the bottom surface of a main body 5a of the electronic component 5. An electrode (for example, ground electrode, etc.) provided on the bottom surface of the main body 5a is connected to the pad 6A through the solder 7. The plurality of pads 6B are arranged around the pad 6A spaced apart therefrom. The pads 6B are each formed in an elongated rectangular shape. An end 5c of a lead 5b of the electronic component 5 is connected to the pads 6B through the solder 7.

Through holes 4c are formed in the circuit board 4. The through holes 4c pass from the front surface 4a to a back surface 4b, and each have an opening on the pad 6A or 6B on the front surface 4a side. While FIG. 3 illustrates only the through holes 4c having an opening on a front surface 6a of the pad 6A, the through holes 4c having an opening on the pad 6B have the same structure as that having an opening on the pad 6A.

A conductive layer 8 is formed on the inner surface of the through holes 4c. The conductive layer 8 is formed of a metal or the like having a thermal conductivity by plating or the like. In the first embodiment, the conductive layer 8 corresponds to a heat-transfer layer. The conductive layer 8 is connected to the pads 6A and 6B in a portion that is not a connection layer 10. Accordingly, the heat generated by the electronic component 5 is transferred to the back surface 4b of the circuit board 4 via the solder 7, the pads 6A and 6B, and the conductive layer 8. This structure facilitates to suppress the overheat of the electronic component 5. The electronic component 5 corresponds to a heat generating element.

A through portion 4d inside the conductive layer 8 is blocked by a block 9 containing a resin material. The through portion 4d inside the conductive layer 8 on the through holes 4c has an opening on the pad 6A or 6B. If the block 9 is not provided and the solder 7 melted during the reflow process flows into the through portion 4d, a sufficient amount of the solder 7 may not be ensured for connecting the electronic component 5 and the pads 6A and 6B. Further, if the solder 7 flowing into the through portion 4d comes out on the back surface 4b of the circuit board 4, it may cause trouble on the back surface 4b side. From this viewpoint, in the first embodiment, the through portion 4d of the through holes 4c is blocked by the block 9 containing a resin material. Thus, it is relatively easy to prevent trouble due to the solder 7 flowing into the through hole 4c. The block 9 containing a resin material need not be provided to the entire area of the through hole 4c (the through portion 4d) in the depth direction, and only part of the through hole 4c is required to be blocked by the block 9. However, preferably, the block 9 is present in part of the through hole 4c on the side of the pads 6A and 6B.

The block 9 is preferably formed of a solder mask. With this, the block 9 can be relatively easily formed during the process of applying solder resist to the front surface 4a or the back surface 4b of the circuit board 4.

In the first embodiment, the resin material contained in the block 9 may generate a bubble (void) when the circuit board 4 is heated during the reflow process or the like. Since the block 9 is covered with the solder 7 on the electronic component 5 side, the bubble is less likely to be discharged compared to the back surface 4b side of the circuit board 4. If a bubble is formed in the solder 7, the solder 7 is not present in the portion of the bubble. This may reduce the connection strength between the electronic component 5 and the pads 6A and 6B through the solder 7, the electrical characteristics, and the heat radiation performance through the solder 7 and the conductive layer 8. For this reason, in the first embodiment, the connection layer 10 (10a and 10b) containing a resin material is provided on the front surface 6a of the pads 6A and 6B to connect the block 9 to the periphery (a periphery 6b) of the pads 6A and 6B. The connection layer 10 (10a and 10b) contains a resin material, and are softened when the circuit board 4 is heated, thereby becoming a path of a bubble generated in the block 9. Thus, It is possible to prevent bubbles generated from the resin material from accumulating in the solder 7. From the viewpoint of the temperature characteristics, manufacturability, and the like, the connection layer 10 (10a and 10b) is preferably made of the same material as the block 9 (for example, solder resist). In addition, if made of the same material, the block 9 and the connection layer 10 (10a and 10b) can be formed in the same process. However, the connection layer 10 need not necessarily be made of the same material as the block 9 as long as it is made of a material which is softened when heated and becomes a path of a bubble.

In the first embodiment, the connection layer 10 (10a and 10b) comprises a connection layer 10a and a connection layer 10b. The connection layer 10a connects between the block 9 and the periphery 6b of the pads 6A and 6B. The connection layer 10b connects between the plurality of blocks 9. In the first embodiment, the connection layer 10b corresponds to a second connection layer. Through the connection layer 10b and the block 9 on one end side, the connection layer 10a also connects between the periphery 6b of the pads 6A and 6B and the block 9 on the other end side. That is, the connection layer 10b is part of the connection layer 10 for connecting between the block 9 and the periphery 6b of the pads 6A and 6B.

In the first embodiment, as illustrated in FIG. 2, the plurality of connection layers 10 (10a and 10b) are connected to the block 9. If more paths of bubbles are provided for the block 9, bubbles are more easily discharged. Besides, if a manufacturing defect is present in part of the connection layers 10 (10a and 10b), bubbles are discharged through the other connection layers 10a and 10b.

In the first embodiment, as illustrated in FIG. 2, the connection layers 10 (10a and 10b) include the connection layer 10 (10a and 10b) arranged in a straight line between the block 9 and the periphery 6b of the pad 6A or 6B closest to the block 9. If the connection layer 10 (10a and 10b) is arranged in a straight line or arranged at the shortest distance, the resistance to the pass of bubbles is likely to be low in the connection layer 10 (10a and 10b). Thus, bubbles are more easily discharged.

In the first embodiment, as illustrated in FIG. 2, the plurality of connection layers 10 (10a and 10b) are arranged in a grid on the pad 6A with at least one of the blocks 9 as a grid point (in the first embodiment, all the four blocks 9). With this, a structure, in which the plurality of connection layers 10 (10a and 10b) are connected to the block 9, is relatively easily achieved. Further, the plurality of connection layers 10 (10a and 10b) arranged in a grid resist the flow of the solder 7 softened by the reflow process. This facilitates to prevent the thickness of the solder 7 from varying due to the solder 7 flowing on the pad 6A.

As described above, according to the first embodiment, the connection layer 10b is provided as the second connection layer to connects the plurality of blocks 9. Thus, a structure, in which the plurality of connection layers 10 (10a and 10b) are connected to the one block 9, is relatively easily achieved. Besides, since the connection layer 10b is shared between the two blocks 9, the connection layers 10 can be effectively provided. Moreover, the connection layer 10a connected to the one block 9 serves as a path of bubbles for also the other block 9, and thereby bubbles are more easily discharged.

As illustrated in FIG. 3, the solder 7 that connects the lead 5b of the electronic component 5 to the pad 6B contains a relatively large fillet 7a or 7b correspondingly to a base 5c1 and a tip 5c2 of the end 5c of the lead 5b. The relatively large fillets 7a and 7b contributes considerably to the connection strength between the end 5c and the pads 6A and 6B through the solder 7. It is difficult to form the solder 7 on the connection layer 10a (10). Therefore, on the front surface 6a of the pad 6B to which the end 5c of the lead 5b is connected, the connection layer 10a is preferably formed avoiding the fillets 7a and 7b.

According to the first embodiment, as illustrated in FIG. 2, the connection layer 10a is provided on a center 6e of the pad 6B (the pad 6B located on the upper right of FIG. 2) in the longitudinal direction of the lead 5b (the X direction in FIGS. 2 and 3). As illustrated in FIG. 3, since the relatively large fillets 7a and 7b of the solder 7 are formed at a base 6c and a tip 6d of the pad 6B, it is suitable to provide the connection layer 10a on the center 6e which is the center of the base 6c and the tip 6d of the pad 6B. With this, the connection layer 10a does not prevent the formation of the fillets 7a and 7b.

According to the first embodiment, as illustrated in FIG. 2, the connection layer 10a extends along the short-side direction of the lead 5b (the Y direction in FIG. 2) on the pad 6B (the pad 6B located on the upper right of FIG. 2). With this, the connection layer 10a is not present on the base 6c and the tip 6d of the pad 6B. Thus, the connection layer 10a does not prevent the formation of the fillets 7a and 7b. Moreover, since the connection layer 10a is shorter compared to the case where it extends along the longitudinal direction, bubbles are more easily discharged.

Figure 4:
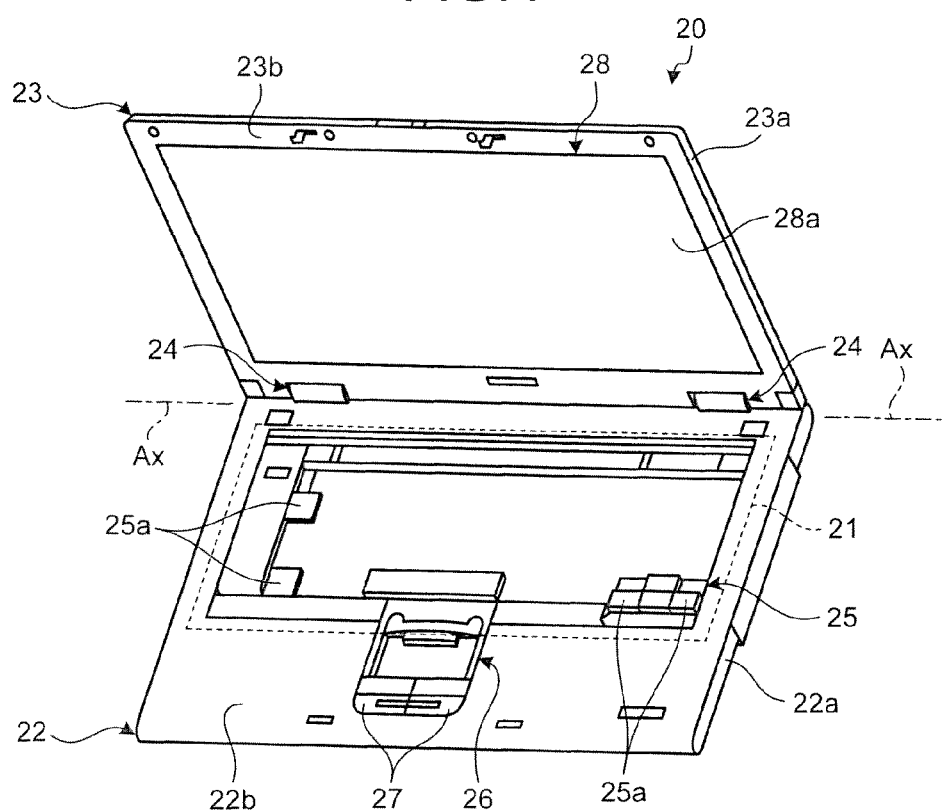
FIG. 4 is an exemplary perspective view of a personal computer as an electronic device according to a second embodiment.

A description will be given of an electronic device according to a second embodiment. As illustrated in FIG. 4, the electronic device of the second embodiment is, for example, a notebook personal computer (PC) 20. The PC 20 comprises a flat rectangular first body 22 and a flat rectangular second body 23. The first body 22 and the second body 23 are connected by a hinge mechanism 24 to be relatively rotatable about a rotation axis Ax between an open position as illustrated in FIG. 4 and a closed position (not illustrated).

The first body 22 is provided with a keyboard 25, a pointing device 26, a click button 27, a display screen 28a of the display panel 28, and the like as input devices, which are exposed on a front surface 22b as the outer surface of a housing 22a. On the other hand, the second body 23 is provided with a display panel 28 as a display device (a component), which is exposed on a front surface 23b as the outer surface of a housing 23a. The display panel 28 may be, for example, a liquid crystal display (LCD) panel. When the PC 20 is in the open position, the keyboard 25, the pointing device 26, the click button 27, the display panel 28, and the like are exposed to allow the user to use them. On the other hand, in the closed position, the front surface 22b closely faces the front surface 23b, and the keyboard 25, the pointing device 26, the click button 27, the display panel 28, and the like are covered between the housings 22a and 23a. Incidentally, FIG. 4 does not illustrate all keys of the keyboard 25 but only keys 25a.

The housing 22a of the first body 22 or the housing 23a of the second body 23 (in the second embodiment, only the housing 22a) houses a circuit board 21 the same as the circuit board 4 previously described in the first embodiment.

The display panel 28 receives a display signal from a control circuit comprising an electronic component or the like (all not illustrated) mounted on the circuit board 21, thereby displaying video including a still image and a moving image. The control circuit of the PC 20 comprises a control module, a storage module such as ROM, RAM, and HDD, an interface circuit, and various controllers (all not illustrated). The PC 20 further comprises a built-in speaker and the like (not illustrated) for outputting audio.

Although not illustrated in FIG. 4, at least part of the circuit board 21 has the same structure as the pads 6A and 6B, the conductive layer 8, the block 9, the connection layers 10 (10a and 10b), and the like previously described in the first embodiment. Thus, the PC 20 as the electronic device of the second embodiment can achieve the same effect as the first embodiment.

Figure 5:
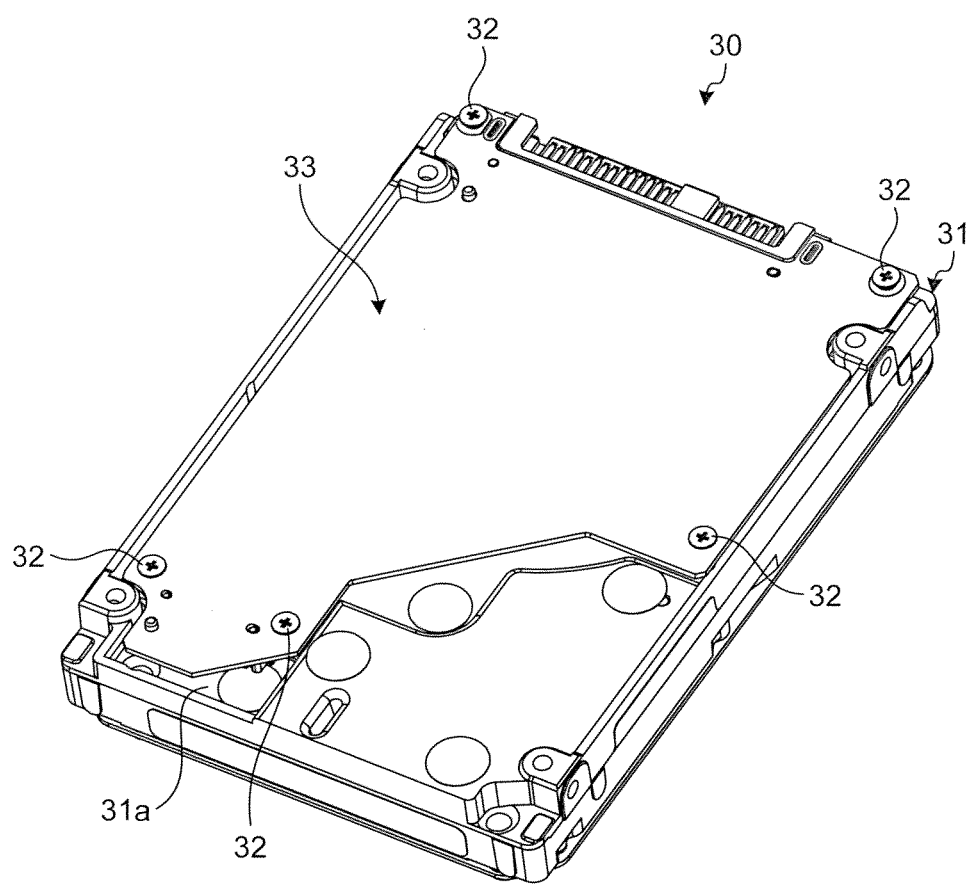
FIG. 5 is an exemplary perspective view of a magnetic disk device as an electronic device according to a third embodiment.

A description will be given of an electronic device according to a third embodiment. As illustrated in FIG. 5, the electronic device of the third embodiment is, for example, a magnetic disk device 30. The magnetic disk device 30 comprises a flat rectangular parallelepiped housing 31 and a circuit board (printed circuit board) 33. The housing 31 houses components such as a magnetic disk (not illustrated). The circuit board 33 is attached to the housing 31 with a fastener member such as a screw 32.

The circuit board 33 is located on an upper wall 31a of the housing 31. A film-like insulating sheet (not illustrated) is located between the circuit board 33 and the upper wall 31a. In the third embodiment, the back surface of the circuit board 33 in a view of FIG. 3, i.e., the back surface (not illustrated) of the circuit board 33 facing the upper wall 31a is amount surface where a plurality of electronic components are mounted. The circuit board 33 is provided with a wiring pattern (not illustrated) on the front and back surfaces. Needless to say, electronic components may be mounted on the front surface of the circuit board 33.

Although not illustrated in FIG. 5, in the third embodiment also, at least part of the circuit board 33 has the same structure as the pads 6A and 6B, the conductive layer 8, the block 9, the connection layers 10 (10a and 10b), and the like previously described in the first embodiment. Thus, the magnetic disk device 30 as the electronic device of the third embodiment can achieve the same effect as the first embodiment.

The foregoing embodiments are susceptible to considerable variation in the practice. For example, while the embodiment is described above as being applied to a television apparatus, a notebook PC, and a magnetic disk device, the embodiments may be applied to other electronic devices having a circuit board. The specifications (structure, form, size, diameter, width, height (thickness), cross-sectional area, weight, number, material, arrangement, location, etc.) can be changed as required for the circuit board, the electronic component, the pad, the through hole, the heat-transfer layer, the block, the periphery, the connection layer, the grid arrangement, the solder, the lead, and the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An electronic device comprising: a circuit board configured to be mounted with an electronic component; a pad provided on a surface of the circuit board and electrically coupled to the electronic component; a heat-transfer layer formed on an inner surface of a through hole in the circuit board, the through hole creating an opening in the pad; a block containing a resin material and located inside the heat-transfer layer to block the through hole; a first connection layer containing a resin material and provided only within the periphery of the pad, the first connection layer configured to connect the block to the periphery of the pad, the resin material being softened when heated, and solder provided on the first connection layer, the solder electrically coupling the electronic component to the pad.

2. The electronic device of claim 1, wherein
the first connection layer comprises a plurality of connection layers, and
each of the plurality of connection layers are configured to be connected to the block.

3. The electronic device of claim 2, wherein
the block comprises a plurality of blocks, and
the plurality of connection layers are configured to be arranged in a grid with at least one of the plurality of blocks as a grid point.

4. The electronic device of claim 3, further comprising a second connection layer containing a resin material and provided on the pad, the second connection layer configured to connect between at least two of the plurality of blocks.

5. The electronic device of claim 1, wherein the connection layer is configured to be arranged in a straight line between the block and the periphery of the pad closest to the block.

6. An electronic device comprising: a circuit board configured to be mounted with an electronic component; a pad provided on a surface of the circuit board and electrically coupled to the electronic component; a heat-transfer layer formed on an inner surface of a through hole in the circuit board, the through hole creating an opening in the pad; a block containing a resin material and located inside the heat-transfer layer to block the through hole; connection layer containing a resin material and provided only within the periphery of the pad, the connection layer configured to connect the block to the periphery of the pad, the resin material being softened when heated, and solder provided on the first connection layer, the solder electrically coupling the electronic component to the pad.

7. A circuit board structure comprising: a circuit board configured to be mounted with an electronic component; a pad provided on a surface of the circuit board and electrically coupled to the electronic component; a heat-transfer layer formed on an inner surface of a through hole in the circuit board, the through hole creating an opening in the pad; a block containing a resin material and located inside the heat-transfer layer to block the through hole; connection layer containing a resin material and provided only within the periphery of the pad, the connection layer configured to connect the block to the periphery of the pad, the resin material being softened when heated, and solder provided on the first connection layer, the solder electrically coupling the electronic component to the pad.

* * * * *